(12) United States Patent
Ashbrook et al.

(10) Patent No.: US 6,487,101 B1
(45) Date of Patent: Nov. 26, 2002

(54) USE OF SEARCH LINES AS GLOBAL BITLINES IN A CAM DESIGN

(75) Inventors: Jonathan B. Ashbrook, Huntington, VT (US); Robert E. Busch, Essex Junction, VT (US); Albert M. Chu, Essex Junction, VT (US); Daryl M. Seitzer, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/968,814

(22) Filed: Oct. 2, 2001

(51) Int. Cl.[7] .............................................. G11C 15/00
(52) U.S. Cl. ...................................................... 365/49
(58) Field of Search .......................................... 365/49

(56) References Cited

U.S. PATENT DOCUMENTS

| | | | |
|---|---|---|---|
| 5,226,005 A | 7/1993 | Lee et al. | 365/49 |
| 5,428,564 A | 6/1995 | Winters | 365/49 |
| 5,515,310 A | 5/1996 | Winters | 365/49 |
| 6,046,923 A | 4/2000 | Evans | 365/49 |
| 6,134,135 A * | 10/2000 | Andersson | 365/49 |

* cited by examiner

*Primary Examiner*—David Nelms
*Assistant Examiner*—Tu-Tu Ho
(74) *Attorney, Agent, or Firm*—McGinn & Gibb, PLLC; Daryl K. Neff

(57) ABSTRACT

A method and structure for a content addressable memory (CAM) array having a plurality of memory cells. Each of the memory cells has capacitive storage devices, transistors connected to the storage devices, a wordline connected to and controlling the transistors, bitlines connected to the storage devices through the transistors, combined search and global bitlines connected to the capacitive storage devices. These cells are further arranged into columns, each containing multiplexers connected to the combined search and global bitlines, data-in lines connected to the multiplexers, and search-data lines connected to the multiplexers. Further, the multiplexers select between the data-in lines and the search-data lines to allow the combined search and global bitlines to be alternatively used as data lines and search lines. Also, in the invention each of the columns further has drivers between the multiplexers and the combined search and global bitlines. The drivers drive signals between the multiplexers and the combined search and global bitlines during search and write operations.

18 Claims, 6 Drawing Sheets

USE OF SEARCH LINES AS GLOBAL BITLINES IN A CAM DESIGN

BACKGROUND OF THE INVENTION

1. Field of the Invention

The present invention generally relates to content addressable memories and more particularly to an improved content addressable memory (CAM) that utilizes a single pair of lines as both the global bitlines and the search lines.

2. Description of the Related Art

Generally, CAM arrays have four vertical wires in each column. These are the true and complement bit lines and the true and complement search data lines. DRAM arrays accommodate fewer bits per bit line because of their low bit fine drive, which reduces the maximum column length of the array. This problem is remedied in conventional DRAM arrays by using global bit lines in the column direction to multiplex several banks of memory. However, in a DRAM CAM architecture, the use of global bit lines requires that each memory cell have six wires running over it in the column direction. This can become the pitch limiting factor of the array. The invention described herein provides the addition of global bit lines to a DRAM-based CAM array with no additional area penalty within the array core.

SUMMARY OF THE INVENTION

In view of the foregoing and other problems, disadvantages, and drawbacks of the conventional content addressable memories the present invention has been devised, and it is an object of the present invention to provide a structure and method for improved content addressable memories.

In order to attain the object(s) suggested above, there is provided, according to a preferred aspect of the invention a dynamic random access memory content addressable memory (DCAM) array having a plurality of CAM cells. Each of the CAM cells has storage elements, transistors connected to the storage elements, a wordline connected to and controlling the transistors, bitlines connected to the storage devices through the transistors, and combined search and global bitlines connected to the storage elements. The cells are arranged in columns, each of which also contains multiplexers connected to the combined search and global bitlines, data-in lines connected to the multiplexers, and search-data lines connected to the multiplexers. Further, the multiplexers select between the data-in lines and the search-data lines to allow the combined search and global bitlines to be alternatively used as data lines and search lines.

Preferably, one or more drivers are provided between the multiplexers and the combined search and global bitlines. The driver drives a signal between the multiplexer and the combined search and global bitlines during search and write operations.

As mentioned above, it is desirable to utilize global bitlines in DRAM CAM arrays; However, the use of global bitlines requires a large number of wires, which limits the pitch of the array. The invention directly addresses this issue by utilizing currently available wires (search lines) 33, 34 as the global bitlines, thereby providing global bitlines without requiring any additional physical lines or area penalty within the array core.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, it is desirable to utilize global bitlines in DRAM CAM arrays. However, the use of global bitlines requires a large number of wires (in the column direction), which limits the pitch of the array. The invention directly addresses this issue by utilizing currently available wires (search lines) as the global bitlines, thereby providing global bitlines without requiring any additional physical lines or area penalty within the array core. The present inventors reasoned that since search operations are mutually exclusive of read and write operations, the search data lines can serve also as global bit lines during read and write operations, thereby eliminating the need for extra wires for global bit lines.

Figure 1:
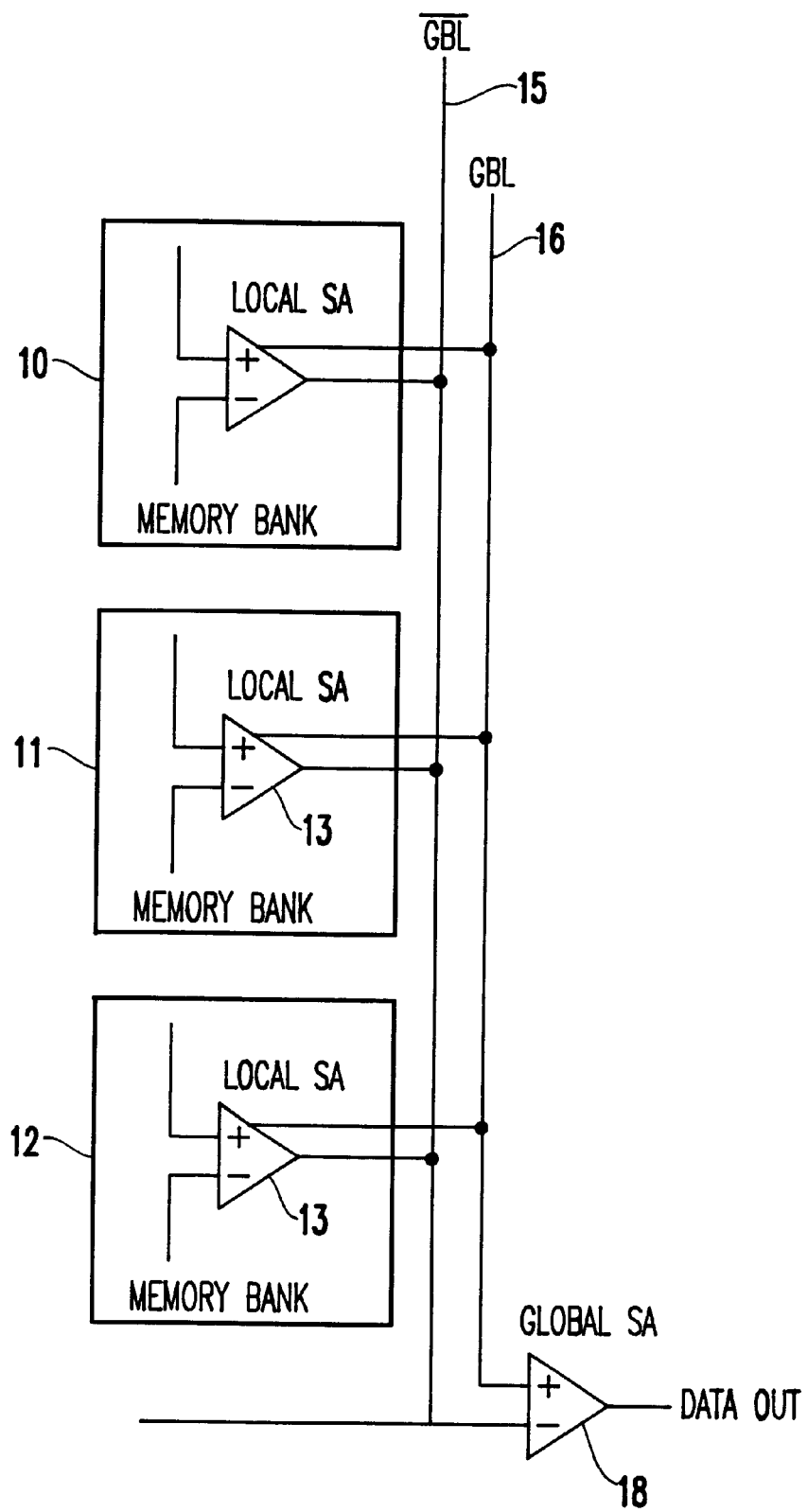
FIG. 1 is a schematic diagram of a content addressable memory column.

FIG. 1 illustrates the use of global bitlines 15, 16 to enhance the performance of DRAM array banks 10–12. The structure shown FIG. 1 is contrasted with the invention described below. However, the structure shown in FIG. 1 is not necessarily prior art and not necessarily known at the time of this invention. In the structure in FIG. 1, global bitlines 15, 16 alter the performance of the different memory banks 10–12 within global bitline driver 18 (global sense amplifier, SA) to increase the number of bits capable of being processed with the memory banks 10–12. The structure of the invention provides a hierarchy of sensing. During a read (critical timing), data is provided to the local sense amps 13. One of these is then enabled and drives data out to the global sense amp 18, which, in turn, drives the data out of the array. This reduces the capacitance seen by individual CAM cells, enabling taller stacks of memory (more cells per bit line).

Figure 2:
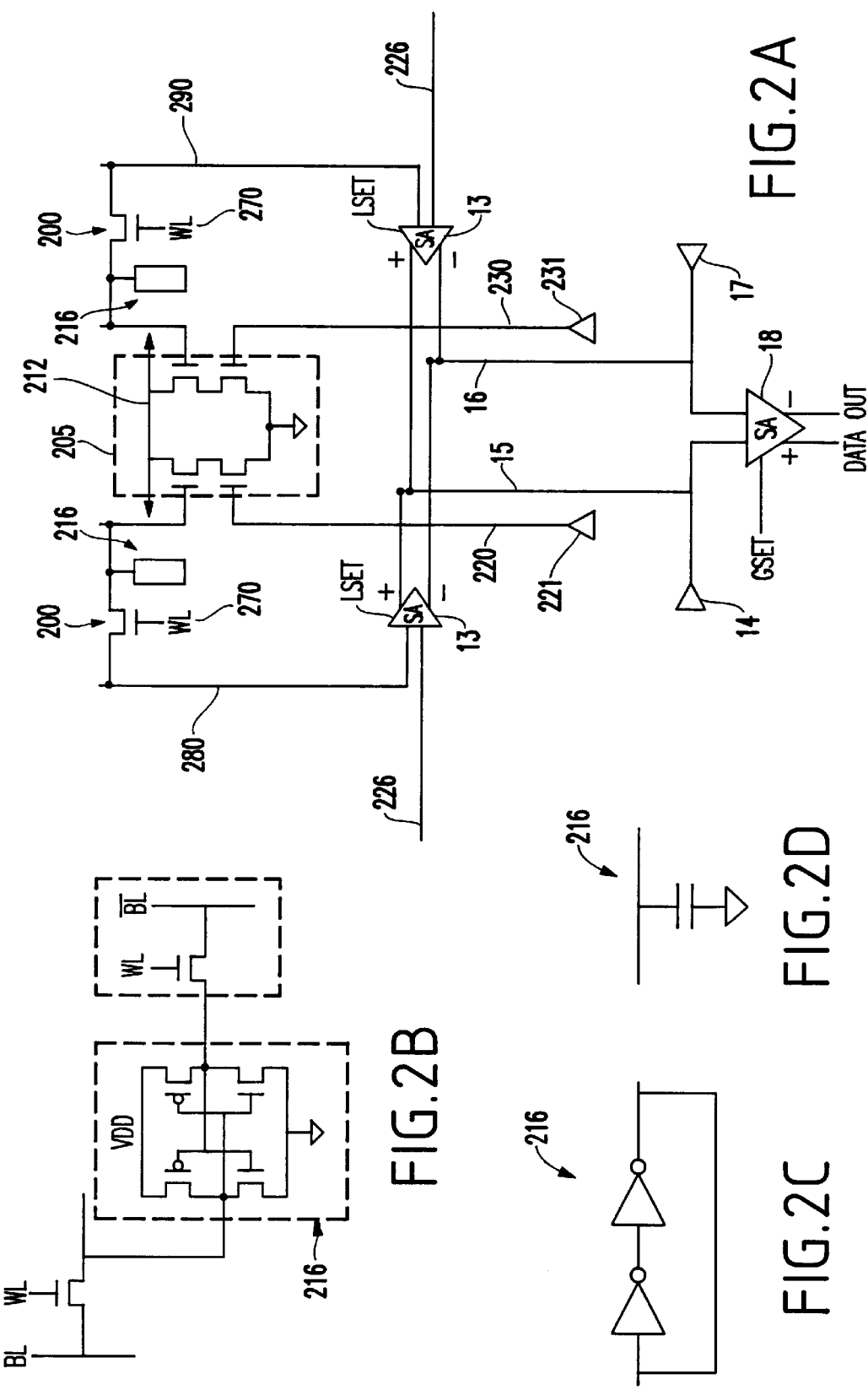
FIGS. 2A–2D are schematic diagrams of content addressable memory cells and related components.
Figure 3:
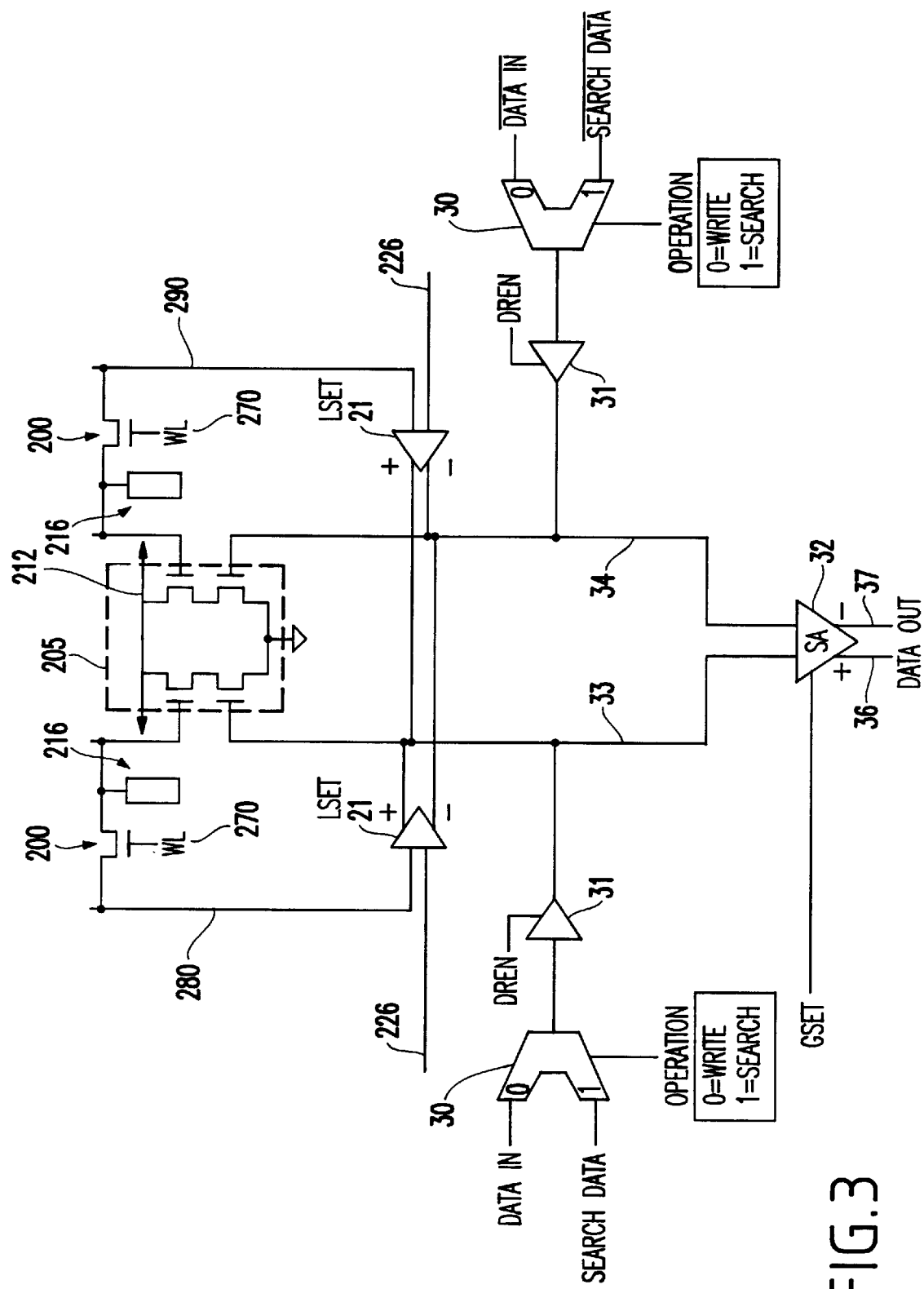
FIG. 3 is a schematic diagram of a content addressable memory cell; and its related components.

FIGS. 2A–3 illustrate ternary CAMs. FIG. 2A is similarly not necessarily prior art and not necessarily known at the time of the invention. FIG. 2A illustrates a ternary CAM memory cell (such as one of the memory cells 10–12, shown in FIG. 1). Ternary CAM's have the following features. There are two storage elements per CAM cell. However, the CAM cell can be masked with a "0", "0" stored bit combination. For normal operation the two storage elements store complementary data. The ternary CAM cell operates as follows:

TABLE 1

| | First Storage Element | Second Storage Element | Result |
|---|---|---|---|
| Stored Value | 1 | 0 | Stored bit as 1 |
| | 0 | 1 | Stored bit as 0 |
| | 0 | 0 | CAM cell is masked |
| | 1 | 1 | Not allowed state |

Storage elements 216 are connected to either the bitline 280, or its complement 290 through transistors 200 (however, as discussed below, these are not necessarily complementary). The transistors 200 are controlled by having their gates connected to wordlines 270. In addition, the match logic 205 accommodates a search request from search line 220 and its complement 230. The match logic 205 is connected to a matchline 212 (ML) that spans across the entire array in a manner similar to a wordline. Buffers are shown as items 14, 17, 221 and 231. The operation and structure of the transistors within the match logic 205 is well known to those ordinarily skilled in the art and is not discussed in detail herein. One primary sense amplifier 13 senses the signal between bitline 280 and a reference bitline 226. The other primary sense amplifier 13 senses the signal between the bitline 290 and a reference bitline 226. Buffers 14, 17, 221 and 231 only deliver data to the corresponding lines and do not receive data therefrom.

FIG. 2B shows an SRAM implementation of the storage element 216 shown in FIG. 2, and FIG. 2C shows a schematic representation of the same. Thus, as would be understood by one ordinarily skilled in the art, the storage elements 216 could comprise cross-coupled CMOS inverters. Depending upon the implementation, another pass gate and driver may be required for the SRAM cell. However this would be per storage element, and not per CAM cell. Alternatively, in a DRAM implementation, as shown in FIG. 2D, the storage element 216 comprises a storage capacitor having one plate tied to the drain of transistor 200 and the other plate tied to the ground.

The global bitlines 15, 16 are used as described above with respect to FIG. 1. If one considers the direction in which wordlines and matchlines traverse the memory cell to be "horizontal", the generally orthogonal direction in which bitlines travel can be called "vertical", although both wordlines and bitlines run generally parallel to the surface of the wafer. Therefore, this structure includes two vertical bitlines 280, 290 two vertical search lines 220, 230 and two global vertical bitlines 15, 16 (6 vertical lines in total). This large number of wires (6 vertical lines per memory cell) consumes much area of the memory array and limits the size and/or density of the memory array.

FIG. 3 depicts one embodiment of the invention showing dual use of search lines as global bit lines. FIG. 3 is somewhat similar to FIG. 2A and the same items are identified with the same numbers. Instead of including separate global bitlines 15, 16 and separate search lines 220, 230, as done in FIG. 2A, the invention includes a single search/global bitline 33 and its complement 34. In addition, multiplexers 30 and drivers 31 are included to selectively utilize lines 33, 34 non-concurrently as either search lines or global bitlines.

In FIG. 3, the reference bitlines 226 are optional. More specifically, when the reference bitlines are present, each primary sense amplifier 21 performs differential sensing between the bitline voltage and the voltage on the reference bitline. When the reference bitlines 226 are not present, each primary sense amplifier 21 does "direct sensing". When direct sensing, the sense amplifiers sense the "1" or "0" state from the voltage or current on the bitline, without using a voltage from a reference bitline.

Search data and regular input data are multiplexed into the combined search and global bitlines 33, 34 via the DREN signals to drivers 31, as discussed in greater detail below. Global bitlines (true and complement) physically share the same wire as the search bit lines (true and complement) 33, 34. Additional requirements are placed on the control sequence when using this scheme. As mentioned above, the CAM cell shown in FIG. 2A includes global bit lines and search lines implemented as separate wires. The implementation depicted in FIG. 2A can lead to a larger array size because of the additional two wires running over the cell. Combined search and global bit lines require the addition of a multiplexer 30 and a driver 31, but eliminate the need for a second pair of buffers 221, 231 when implementing search and global bit lines on separate physical lines. Item 212 in FIG. 3 is the matchline and item 226 is the reference signal. FIG. 2A includes buffers 14, 17, 221, 231. The buffers 14, 17 need an enable signal. However, buffers 221, 231 would not require an enable signal.

Several of the structures shown in FIG. 3 are grouped into a bank column (10–12 of FIG. 1). Each bank then has two local sense amps 21. Several banks are stacked to form a full column. Each column has the multiplexor 30, global drivers 31, and global sense amp 32. Bitlines 280 and 290 are wires that are separate in each bank, where search/GBL 33 and 34 are wires that span the entire column.

Figure 6:
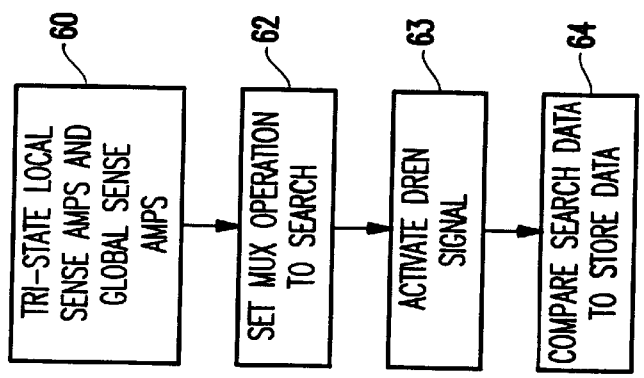
FIG. 6 is a flow diagram illustrating a preferred method of the invention.
Figure 5:
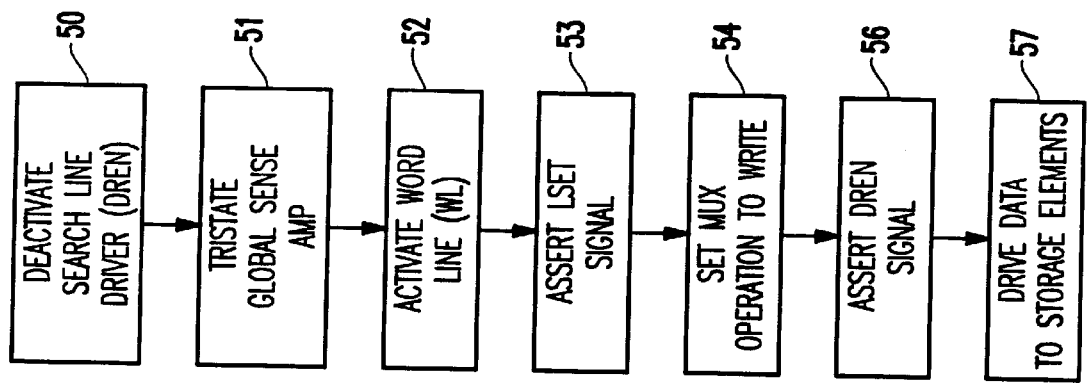
FIG. 5 is a flow diagram illustrating a preferred method of the invention.
Figure 4:
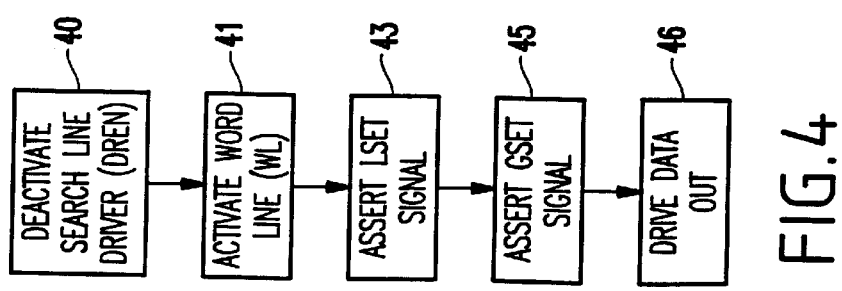
FIG. 4 is a flow diagram illustrating a preferred method of the invention.

The operation of the structure shown in FIG. 3 will be described with respect to the flowcharts in FIGS. 4–6. FIG. 4 illustrates a read operation, FIG. 5 illustrates a write operation, and FIG. 6 illustrates a search operation. During a read operation, (as shown in FIG. 4) the invention deactivates the search lines 33, 34 by deactivating the search line driver 31 with the DREN (DRiver ENable signal) signal being low (item 40). In item 41, the invention activates the wordlines 270, which activates transistors 200 to allow electrical contact between the storage elements 216 and the bitlines 289, 290. The invention asserts the LSET signal 210 which activates the local sense amp 21, as shown in item 43. The invention asserts the GSET signal, in item 45, which activates the global sense amp/output driver 32. The data out lines 36, 37 from global sense amplifier 32 now indicate the state of the datum rad from the memory cell (item 46).

For the write operation, as shown in FIG. 5, the invention again deactivates search line drivers 31 by holding DREN signals at a low state (item 50). The invention tristates the global sense amp in item 51 and the wordline 270 is activated in item 52. The LSET signal is then asserted to set the local sense amp 21 (item 53). After a write back interval, the actual writing of new data can begin (item 54) by setting the mux operation to write. The DREN signal (item 56) is then asserted to activate the drivers 31 to drive the data into the storage elements 216 (item 57).

FIG. 6 illustrates the search operation with the inventive structure shown in FIG. 3. Initially, the local sense amp 21 and the global sense amp/output driver 32 are tri-stated, i.e., switched off from global bitlines 33, 34 and bitlines 280, 290 in each case (item 61). The multiplexer 30 is set to search, in item 62, such that multiplexers 30 output the "search data" signals. Additionally, the DREN signals are raised to a high level (activated) in item 63 which activates drivers 31. With the signals in their proper state, the search data is compared to stored data as shown in item 64. The local sense amp 31 and global sense amp 32 are both "tri-stated" to reduce power consumption, because they are not needed in this operation. Thus, the drivers 31 drive the data all the way to each cell. The match logic 205 can then react to a whole row of cells along the activated wordline and indicate whether there is a match with the search data.

Figure 7:
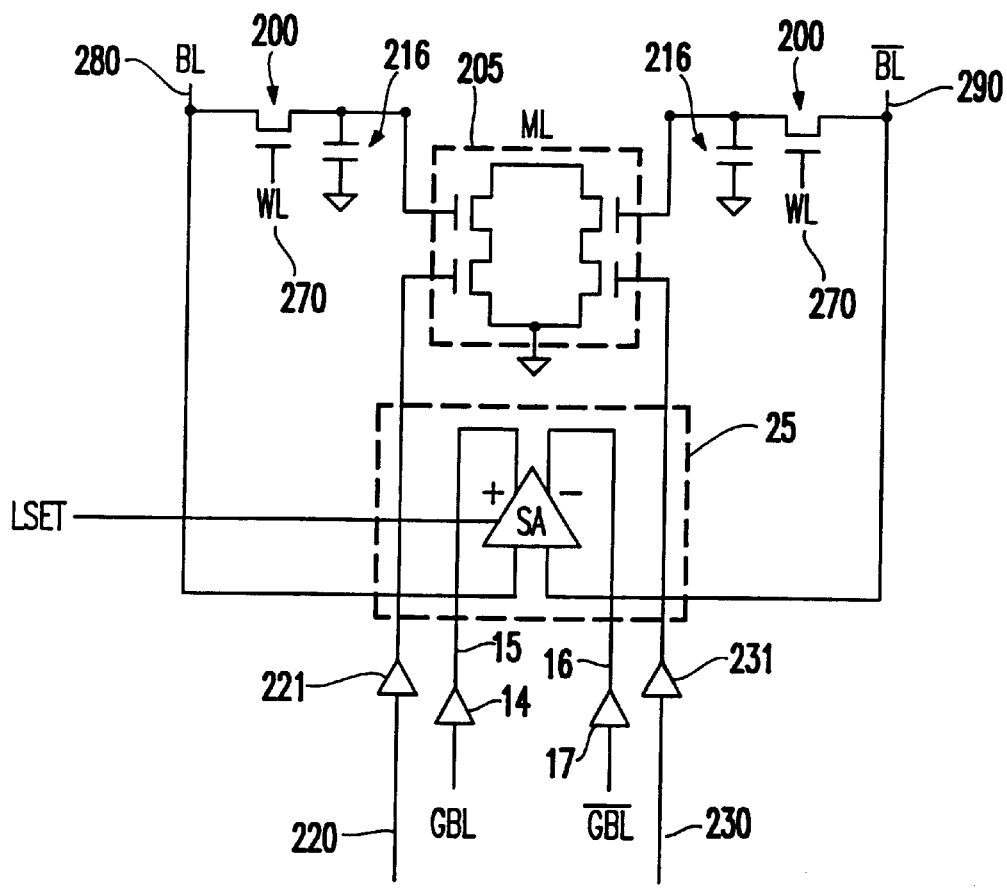
FIG. 7 is a diagram showing a specific binary dynamic CAM embodiment.
Figure 8:
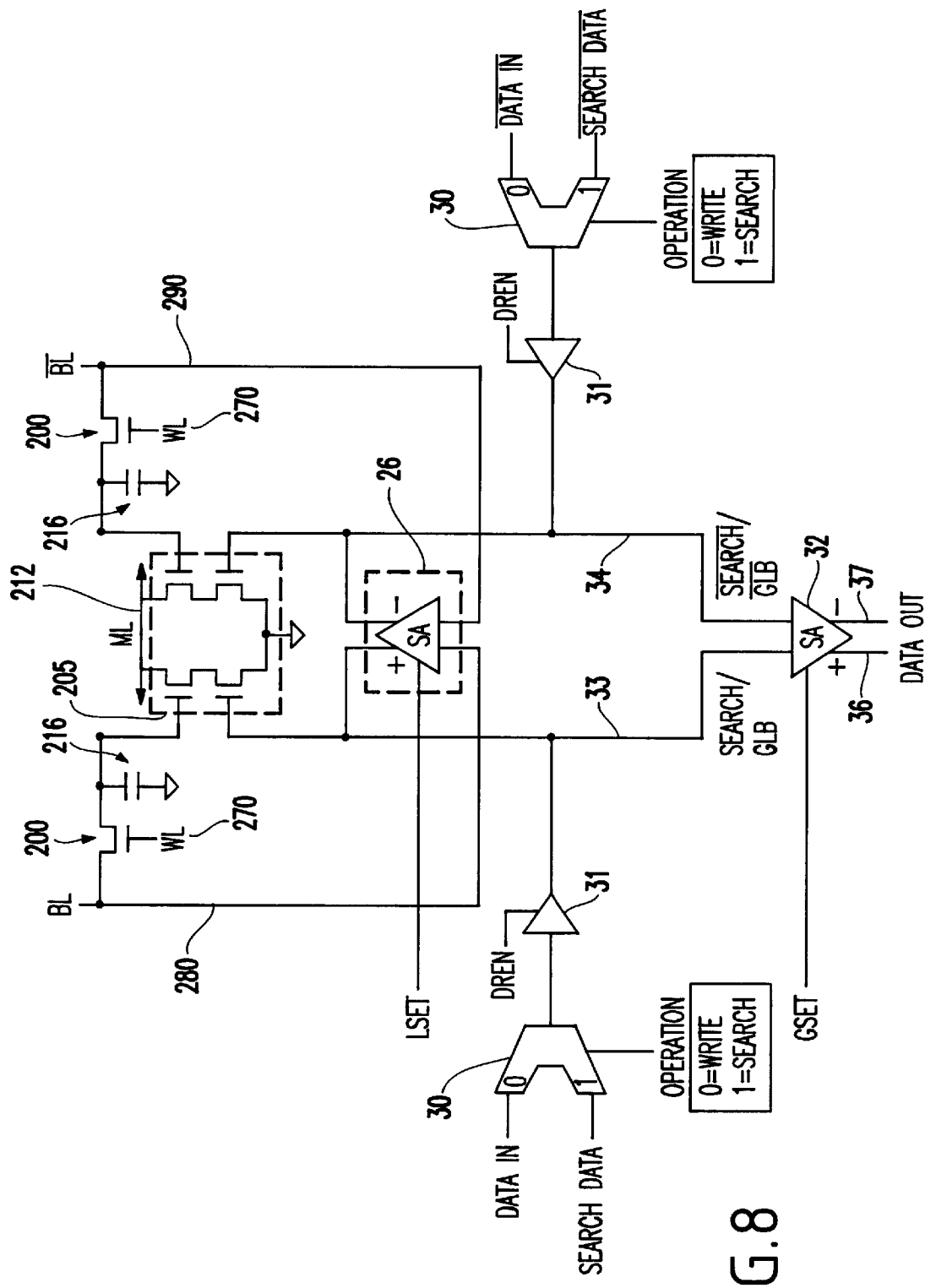
FIG. 8 is a diagram showing a specific binary dynamic CAM embodiment.

FIGS. 7 and 8 show binary dynamic CAM arrangements. FIGS. 7 and 8 are similar to the structure shown in FIGS. 2A and 3, and the same items are identified with the same reference numbers. In FIGS. 7 and 8, a capacitor is used as the storage element 216, however, a pair of cross-coupled CMOS inverters could be used instead. In addition, a single sense amplifier 25 (or 26 in the case of FIG. 8) is included in place of the separate sense amplifiers 13, 21. The sense amplifier 25 (or 26 in the case of FIG. 8) do differential sensing between the voltage on the bitlines 280, 290. Thus, FIG. 7 illustrates a more specific binary dynamic CAM embodiment which is not necessarily known prior art to the invention. Data can only be stored which is complementary, in the following manner:

TABLE 2

|  | First Storage Element | Second Storage Element | Result |
|---|---|---|---|
| Stored Value | 1 | 0 | Stored bit as 1 |
|  | 0 | 1 | Stored bit as 0 |

FIG. 8 is a schematic diagram of a binary dynamic CAM embodiment of the invention. In this embodiment, lines 33 and 34 each serve as combined search and global bitlines. Multiplexers 30, global drivers 31, and global sense amps 32 operate in the manner as described above with respect to FIG. 3. However, the embodiment shown in FIG. 8 has just one primary sense amp 26, in place of two primary sense amps 21, as shown in FIG. 3. Accordingly, in this embodiment, only complementary data is stored in the storage elements 216 of each binary dynamic CAM cell and the results are the same as described in Table 2 above.

The embodiment shown in FIG. 8 operates in the manner described above regarding FIG. 3, with respect to the dual use of global data lines 33, 34 as search lines. Read, write and search operations are performed as described above with respect to FIGS. 4, 5 and 6, respectively.

As mentioned above, it is desirable to utilize global bitlines in DRAM CAM arrays. However, the use of global bitlines requires a large number of wires, which limits the pitch of the array. The invention directly addresses this issue by utilizing currently available wires (search lines) 33, 34 as the global bitlines, thereby providing global bitlines without requiring any additional physical lines or area penalty within the array core.

Wiring savings is a primary benefit of the current invention. However, as previously mentioned, one fewer pair of drivers is needed with the invention. These wires are generally large, so more area at the array periphery can be saved with the invention. The embodiments have presented both SRAM-based CAM as well as dynamic CAM (the storage elements 216 shown as either SRAM cells or storage capacitors). Thus, through the use of one or more multiplexers 30, the invention allows the global bit lines 33, 34 to also serve as search lines, thereby reducing the amount of wiring in the memory structures.

While the invention has been described in terms of preferred embodiments, those skilled in the art will recognize that the invention can be practiced with modification within the spirit and scope of the appended claims.

What is claimed is:

1. An integrated circuit including a memory array, said memory array comprising:
   a memory cell;
   a bitline connected to said memory cell; and
   a combined search and global bitline connected to said memory cell,
   wherein said combined search and global bitline is alternatively used as a data line and a search line.

2. The integrated circuit in claim 1, further comprising:
   a multiplexer connected to said combined search and global bitline;
   a data-in line connected to said multiplexer; and
   a search-data line connected to said multiplexer.

3. The integrated circuit in claim 2, wherein said multiplexer selects between said data-in line and said search-data line to allow said combined search and global bitline to be alternatively used as said data-line and said search line.

4. The integrated circuit in claim 1, further comprising a wordline controlling access between said bitline and said memory cell.

5. The integrated circuit in claim 1, further comprising match logic connected to said memory cell, wherein said match logic controls access between said memory cell and said combined search and global bitline.

6. An integrated circuit including a dynamic random access memory content addressable memory (DCAM) array comprising a plurality of memory cells, wherein each of said memory cells comprises:
   storage elements;
   transistors connected to said storage elements;
   match logic connected to said storage elements;
   wordlines connected to, and controlling said transistors;
   bitlines connected to said storage elements through said transistors; and
   combined search and global bitlines connected to said match logic and to outputs of at least one local sense amplifier, said memory cells being arranged in columns, said columns comprising:
      multiplexers connected to said combined search and global bitlines;
      data-in lines connected to said multiplexers; and
      search-data lines connected to said multiplexers,
   wherein said multiplexers select between said data-in lines and said search-data lines to allow said combined search and global bitlines to be alternatively used as data lines and search lines.

7. The integrated circuit in claim 6, wherein each of said column further comprises a driver between said multiplexers and said combined search and global bitlines, wherein said driver drives a signal between said multiplexers and said combined search and global bitlines during search and write operations.

8. The integrated circuit in claim 6, wherein said memory cells are further organized in banks, wherein each of said banks further comprises two said local sense amplifiers connected to said combined search and global bitlines.

9. The integrated circuit in claim 6, wherein said memory cells includes only two wordlines, two bitlines and two combined search and global bitlines.

10. A method of operating a memory cell, comprising:
    multiplexing a search datum and a write datum onto a global bitline coupled to said memory cell;
    determining if there is a match between said search datum appearing on said global bitline and a stored datum stored in said memory cell; and writing said write datum to said memory cell from said global bitline.

11. The method of claim 10, further comprising reading from said memory cell by transferring said stored datum onto said global bitline.

12. The method of claim 10, wherein multiplexing is performed to operate said global bitline alternatively as a search line and to transfer a datum to and from said memory cell.

13. The method of claim 10, further comprising sensing a signal on said global bitline with a single sense amplifier.

14. The method of claim 10, further comprising controlling access between said bitline and said memory cell using a wordline.

15. A method of operating a memory array having memory cells, said method comprising:

multiplexing a search datum and a write datum onto a global bitline coupled to said memory cell;

determining if there is a match between said search datum appearing on said global bitline and a stored datum stored in said memory cell;

writing said write datum to said memory cell from said global bitline; and controlling access between said global bitline and said memory cell using a wordline.

16. The method of claim 15, further comprising reading from said memory cell by transferring said stored datum onto said global bitline.

17. The method of claim 15, wherein said multiplexing is performed to operate said global bitline alternatively as a search line and to transfer a datum to and from said memory cell.

18. The method of claim 15, further comprising sensing a signal on said global bitline with a single sense amplifier.

* * * * *